(12) United States Patent
Yu et al.

(10) Patent No.: US 8,648,633 B1
(45) Date of Patent: Feb. 11, 2014

(54) CLOCK AND DATA RECOVERY CIRCUIT

(71) Applicants: Global Unichip Corp., Hsinchu (TW); Taiwan Semiconductor Manufacturing Co., Ltd., Hsin-Chu (TW)

(72) Inventors: Po-Shing Yu, Hsinchu (TW); Chia-Hsiang Chang, Hsinchu (TW); Ting-Hao Wang, Hsinchu (TW)

(73) Assignees: Global Unichip Corp., Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/010,997

(22) Filed: Aug. 27, 2013

Related U.S. Application Data

(62) Division of application No. 13/692,017, filed on Dec. 3, 2012, now Pat. No. 8,547,152.

(30) Foreign Application Priority Data

Dec. 5, 2012  (TW) .............................. 100144603 A

(51) Int. Cl.
*H03L 7/06* (2006.01)
(52) U.S. Cl.
USPC ......................................... 327/156; 327/147
(58) Field of Classification Search
USPC .................................................. 327/147, 156
See application file for complete search history.

(56) References Cited

U.S. PATENT DOCUMENTS

| | | | | |
|---|---|---|---|---|
| 3,983,506 | A * | 9/1976 | Rettinger et al. | 331/17 |
| 6,816,019 | B2 * | 11/2004 | Delbo' et al. | 331/17 |
| 7,259,604 | B2 * | 8/2007 | Gomm | 327/175 |
| 7,616,035 | B2 * | 11/2009 | Haerle | 327/157 |
| 7,646,225 | B2 * | 1/2010 | Song et al. | 327/156 |
| 7,724,161 | B1 * | 5/2010 | Cyrusian | 341/53 |
| 8,111,798 | B2 * | 2/2012 | Sai | 375/375 |
| 8,125,278 | B2 * | 2/2012 | Maruko et al. | 331/1 A |
| 8,184,762 | B2 * | 5/2012 | Kesterson et al. | 375/376 |
| 8,362,815 | B2 * | 1/2013 | Pavlovic et al. | 327/156 |
| 8,406,361 | B2 * | 3/2013 | Den Besten et al. | 375/356 |
| 2009/0207961 | A1 * | 8/2009 | Sai | 375/375 |
| 2010/0225369 | A1 * | 9/2010 | Badaroglu | 327/158 |
| 2011/0187423 | A1 * | 8/2011 | Eckhardt et al. | 327/156 |
| 2013/0099836 | A1 * | 4/2013 | Shaeffer et al. | 327/148 |
| 2013/0141145 | A1 * | 6/2013 | Yu et al. | 327/157 |

* cited by examiner

*Primary Examiner* — Adam Houston
(74) *Attorney, Agent, or Firm* — McClure, Qualey & Rodack, LLP

(57) ABSTRACT

The invention provides a clock and data recovery (CDR) circuit, including a phase locked loop (PLL) circuit, providing a reference voltage; a first delay device, delaying an input data so as to generate a first delay signal; an edge detector, generating an edge signal according to the first delay signal and the input data; a second delay device, delaying the edge signal according to a control signal so as to generate a second delay signal; a first gated voltage-controlled oscillator, generating an output recovery clock according to the second delay signal and the reference voltage; a phase detector, detecting a phase difference between the first delay signal and the output recovery clock so as to generate a phase signal and a output recovery data; and an amplifier, amplifying the phase signal by a factor so as to generate the control signal.

5 Claims, 4 Drawing Sheets

CLOCK AND DATA RECOVERY CIRCUIT

CROSS REFERENCE TO RELATED APPLICATIONS

This application is a divisional application of co-pending U.S. application Ser. No. 13/692,017, filed Dec. 3, 2012, which claims priority of Taiwan Patent Application No. 100144603 filed on Dec. 5, 2011, the entireties of which are incorporated by reference herein.

BACKGROUND OF THE INVENTION

1. Field of the Invention

The disclosure generally relates to a clock and data recovery (CDR) circuit, and more particularly, relates to a CDR circuit for reducing bit error rate (BER).

2. Description of the Related Art

In the field of communication by optical fibers, a clock and data recovery (CDR) circuit is required for a receiver to recover received signals. Generally speaking, the CDR circuit comprises a phase locked loop (PLL) circuit which provides a control voltage for an oscillator. The CDR circuit is mainly configured to generate a recovery data and a recovery clock according to the received signals.

Traditionally, on account of variations in manufacturing processes, a CDR circuit often generates phase errors between the recovery data and the recovery clock, which increases bit error rate (BER). For solving the foregoing problem, it is required that a new CDR circuit is designed so as to improve phase alignment and reduce BER.

BRIEF SUMMARY OF THE INVENTION

In one exemplary embodiment, the disclosure is directed to a clock and data recovery (CDR) circuit, comprising: a phase locked loop (PLL) circuit, providing a reference voltage; a first delay device, delaying an input data according to a control signal so as to generate a first delay signal; an edge detector, generating an edge signal according to the first delay signal and the input data; a second delay device, delaying the edge signal so as to generate a second delay signal; a first gated voltage-controlled oscillator, generating an output recovery clock according to the second delay signal and the reference voltage; a phase detector, detecting a phase difference between the first delay signal and the output recovery clock so as to generate a phase signal and a output recovery data; and an amplifier, amplifying the phase signal by a factor so as to generate the control signal.

In another embodiment, the disclosure is directed to a clock and data recovery (CDR) circuit, comprising: a phase locked loop (PLL) circuit, providing a reference voltage; a first delay device, delaying an input data so as to generate a first delay signal; an edge detector, generating an edge signal according to the first delay signal and the input data; a second delay device, delaying the edge signal according to a control signal so as to generate a second delay signal; a first gated voltage-controlled oscillator, generating an output recovery clock according to the second delay signal and the reference voltage; a phase detector, detecting a phase difference between the first delay signal and the output recovery clock so as to generate a phase signal and a output recovery data; and an amplifier, amplifying the phase signal by a factor so as to generate the control signal.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
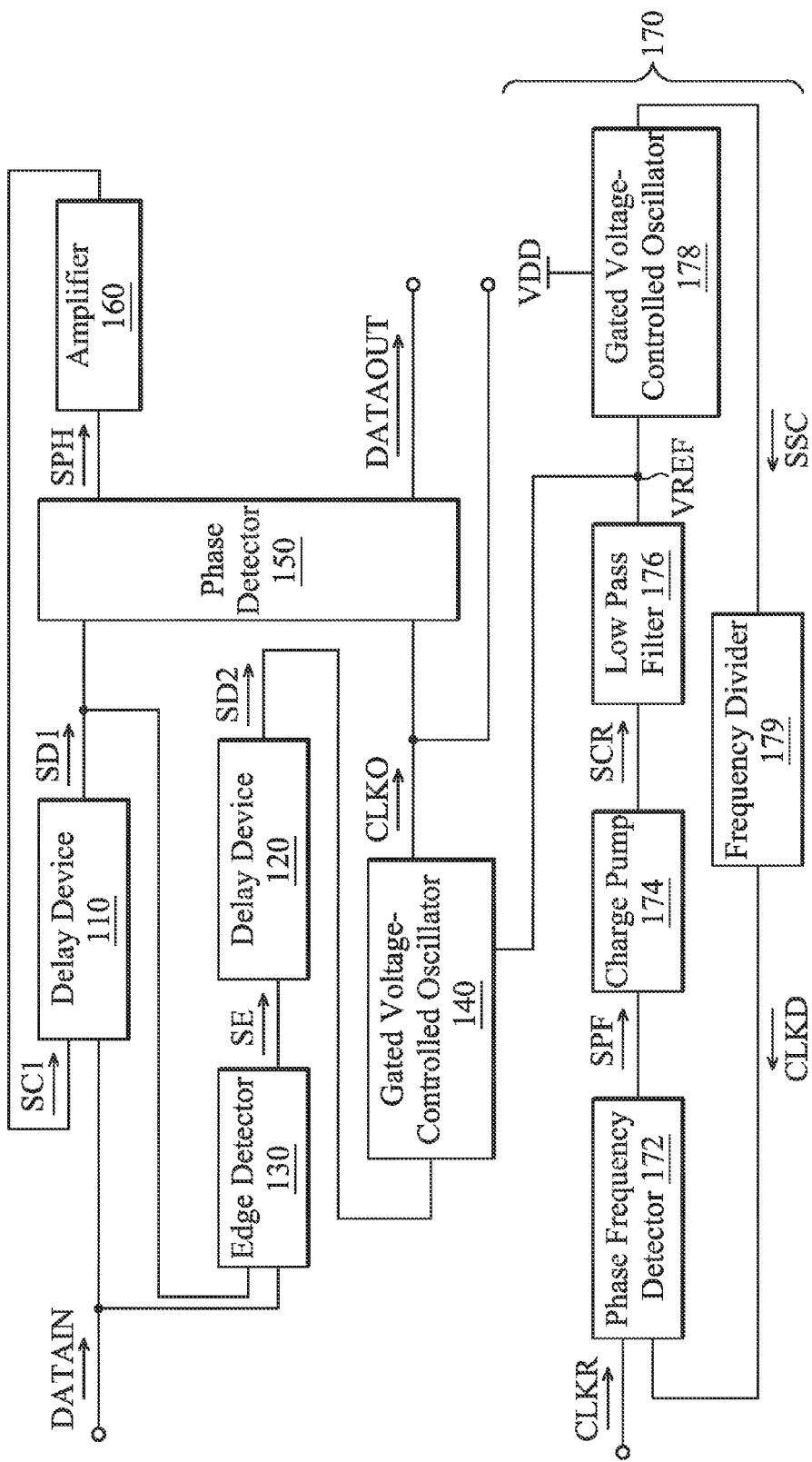
FIG. 1 is a diagram for illustrating a clock and data recovery (CDR) circuit according to an embodiment of the invention.

FIG. 1 is a diagram for illustrating a clock and data recovery (CDR) circuit 100 according to an embodiment of the invention. As shown in FIG. 1, the CDR circuit 100 comprises: delay devices 110 and 120, an edge detector 130, a gated voltage-controlled oscillator (GVCO) 140, a phase detector 150, an amplifier 160, and a phase locked loop (PLL) circuit 170.

The PLL circuit 170 provides a reference voltage VREF so as to control the GVCO 140. The delay device 110 is configured to delay an input data DATAIN according to a control signal SC1 so as to generate a delay signal SD1, which is utilized for adjusting a delay time of the delay device 110. The edge detector 130 is configured to generate an edge signal SE according to the delay signal SD1 and the input data DATAIN, and more particularly, the edge detector 130 is configured to detect rising edges and/or falling edges of the delay signal SD1 and the input data DATAIN so as to generate the edge signal SE. The delay device 120 is configured to delay the edge signal SE so as to generate a delay signal SD2. The GVCO 140 is configured to generate an output recovery clock CLKO according to the delay signal SD2 and the reference voltage VREF. The phase detector 150 is configured to detect a phase difference between the delay signal SD1 and the output recovery clock CLKO so as to generate a phase signal SPH and an output recovery data DATAOUT. The amplifier 160 is configured to amplify the phase signal SPH by a factor K1 so as to generate the control signal SC1. It is noted that the factor K1 may be a positive number or a negative number but cannot be equal to 0. The control signal SC1 can be expressed as Equation (1).

$$SC1 = K1 * SPH, \qquad \text{Equation (1):}$$

where SPH represents the phase signal, and K1 represents a gain factor of the amplifier 160.

In one embodiment, the PLL circuit 170 comprises: a phase frequency detector (PFD) 172, a charge pump (CP) 174, a low pass filter (LPF) 176, a GVCO 178, and a frequency divider 179. The phase frequency detector 172 is configured to generate a phase frequency signal SPF according to a reference clock CLKR and a divided clock CLKD. The charge pump 174 is configured to generate a current signal SCR according to the phase frequency signal SPF. The low pass filter 176 is configured to filter the current signal SCR so as to generate the reference voltage VREF. The GVCO 178 is configured to generate an oscillation signal SCC according to the reference voltage VREF and a work voltage VDD. The frequency divider 179 is configured to generate the divided clock CLKD according to the oscillation signal SCC, wherein the frequency of the oscillation signal SCC is N times greater than that of the divided clock CLKD, and N is a positive number. It is noted that the PLL circuit 170 is just one example, and the invention may be implement with a variety of PLL circuits.

Figure 2A:
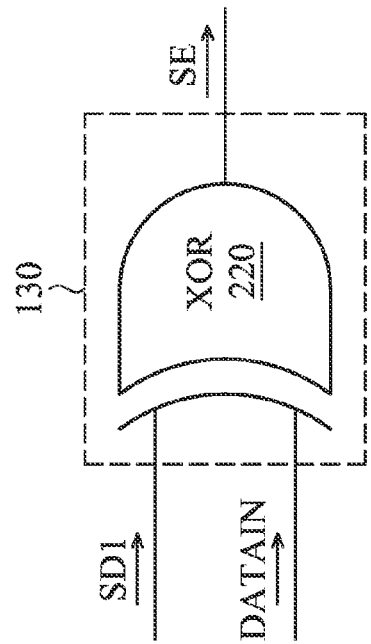
FIG. 2A is a diagram for illustrating an edge detector according to an embodiment of the invention.

FIG. 2A is a diagram for illustrating the edge detector 130 according to an embodiment of the invention. As shown in FIG. 2A, the edge detector 130 may be an NAND gate 210, which is configured to generate the edge signal SE according to the delay signal SD1 and the input data DATAIN.

Figure 2B:
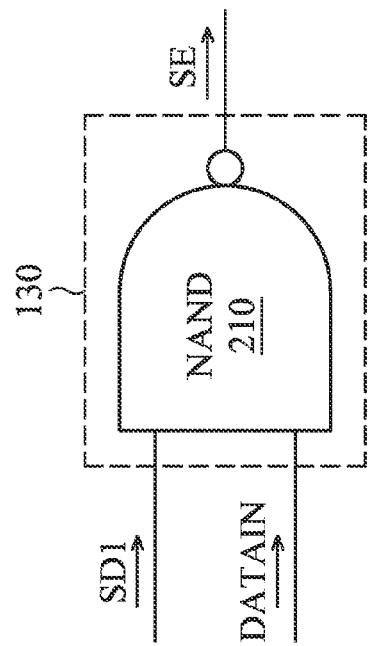
FIG. 2B is a diagram for illustrating an edge detector according to another embodiment of the invention.

FIG. 2B is a diagram for illustrating the edge detector 130 according to another embodiment of the invention. As shown in FIG. 2B, the edge detector 130 may be an XOR gate 220, which is configured to generate the edge signal SE according to the delay signal SD1 and the input data DATAIN.

Figure 3:
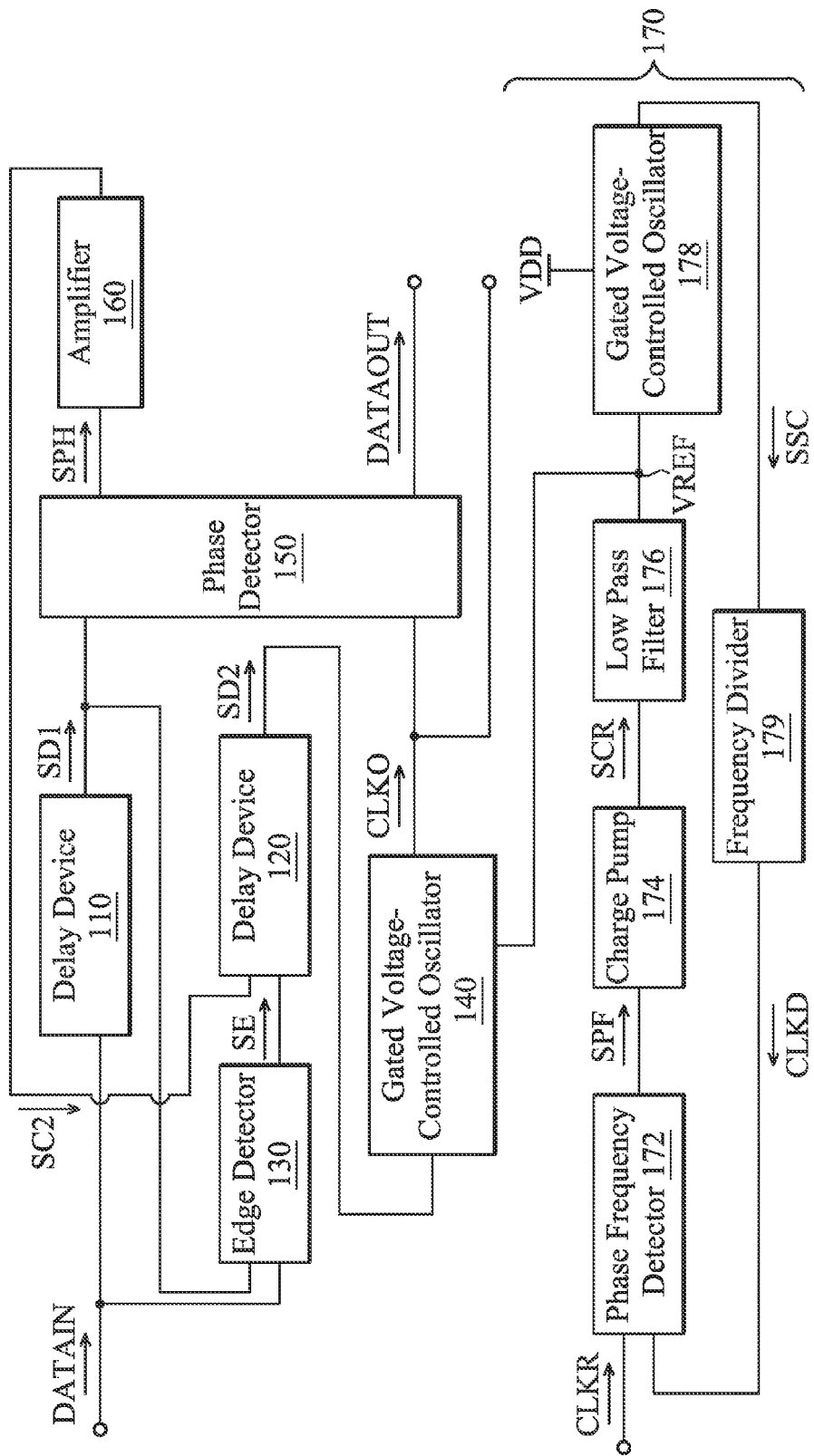
FIG. 3 is a diagram for illustrating a CDR circuit according to another embodiment of the invention.

FIG. 3 is a diagram for illustrating a CDR circuit 300 according to another embodiment of the invention. The CDR circuit 300 in FIG. 3 is similar to the CDR circuit 100 in FIG. 1, but the difference between them is illustrated as follows. The amplifier 160 and its feedback path are both removed, and another amplifier 180 is included. The amplifier 180 is configured to amplify the phase signal SPH by a factor K2 so as to generate a control signal SC2. It is noted that the factor K2 may be a positive number or a negative number but cannot be equal to 0. The control signal SC2 can be expressed as Equation (2).

$$SC2 = K2 * SPH,\qquad\text{Equation (2):}$$

where SPH represents the phase signal, and K2 represents a gain factor of the amplifier 180.

In the embodiment, the delay device 120 is configured to delay the edge signal SE according to the control signal SC2 so as to generate the delay signal SD2, wherein the control signal SC2 is utilized for adjusting a delay time of the delay device 120.

Figure 4:
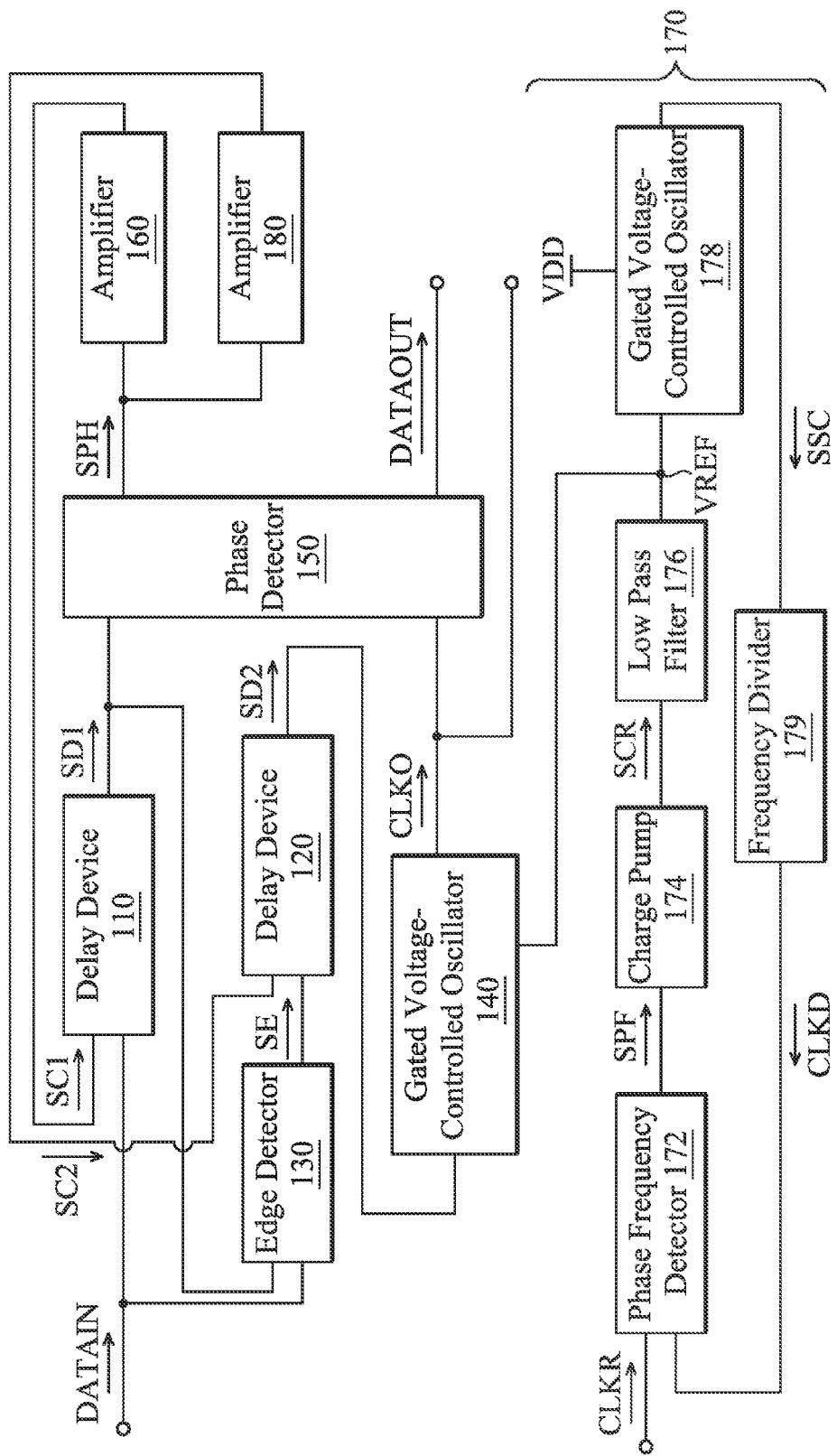
FIG. 4 is a diagram for illustrating a CDR circuit according to an embodiment of the invention.

FIG. 4 is a diagram for illustrating a CDR circuit 400 according to an embodiment of the invention. The CDR circuit 400 in FIG. 4 is similar to the CDR circuit 100 in FIG. 1, but the difference between them is illustrated as follows. The CDR circuit 400 comprises two amplifiers 160 and 180. The amplifier 160 is configured to amplify the phase signal SPH by a factor K1 so as to generate the control signal SC1, and the amplifier 180 is configured to amplify the phase signal SPH by a factor K2 so as to generate the control signal SC2. Each of the factors K1 and K2 may be a positive number or a negative number or 0; however, it is not permitted that the factors K1 and K2 are both equal to 0.

The CDR circuits of the invention can improve phase alignment and reduce BER. The invention solves the problem where traditional CDR circuits have unstable outputs on the account of different manufacturing processes.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A clock and data recovery (CDR) circuit, comprising:
 a phase locked loop (PLL) circuit, providing a reference voltage;
 a first delay device, delaying an input data so as to generate a first delay signal;
 an edge detector, generating an edge signal according to the first delay signal and the input data;
 a second delay device, delaying the edge signal according to a control signal so as to generate a second delay signal;
 a first gated voltage-controlled oscillator, generating an output recovery clock according to the second delay signal and the reference voltage;
 a phase detector, detecting a phase difference between the first delay signal and the output recovery clock so as to generate a phase signal and a output recovery data; and
 an amplifier, amplifying the phase signal by a factor so as to generate the control signal.

2. The clock and data recovery circuit as claimed in claim 1, wherein the PLL circuit comprises:
 a phase frequency detector, generating a phase frequency signal according to a reference clock and a divided clock;
 a charge pump, generating a current signal according to the phase frequency signal;
 a low pass filter, filtering the current signal so as to generate the reference voltage;
 a second gated voltage-controlled oscillator, generating an oscillation signal according to the reference voltage and a work voltage; and
 a frequency divider, generating the divided clock according to the oscillation signal.

3. The clock and data recovery circuit as claimed in claim 1, wherein the edge detector is an NAND gate.

4. The clock and data recovery circuit as claimed in claim 1, wherein the edge detector is an XOR gate.

5. The clock and data recovery circuit as claimed in claim 1, wherein the factor is not equal to 0.

* * * * *